United States Patent
Szczech et al.

(10) Patent No.: US 9,307,328 B2
(45) Date of Patent: Apr. 5, 2016

(54) INTERPOSER FOR MEMS-ON-LID MICROPHONE

(71) Applicant: Knowles Electronics, LLC, Itasca, IL (US)

(72) Inventors: John Szczech, Schaumburg, IL (US); Joshua Watson, Aurora, IL (US); Gregory B. Servis, Bloomingdale, IL (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 14/590,635

(22) Filed: Jan. 6, 2015

(65) Prior Publication Data
US 2015/0195659 A1 Jul. 9, 2015

Related U.S. Application Data

(60) Provisional application No. 61/925,359, filed on Jan. 9, 2014.

(51) Int. Cl.
*H04R 19/04* (2006.01)
*H04R 23/00* (2006.01)
(Continued)

(52) U.S. Cl.
CPC .............. *H04R 19/04* (2013.01); *H04R 19/005* (2013.01); *H04R 23/006* (2013.01); *H01L 2224/48091* (2013.01); *H01L 2224/48137* (2013.01);
(Continued)

(58) Field of Classification Search
CPC .... H04R 19/005; H04R 19/016; H04R 19/04; H04R 23/00; H04R 23/006; H04R 2201/003; H04R 1/086; H04R 31/00; B81B 7/0064; B81B 2201/0257

USPC ......... 381/113, 355, 360, 369, 174, 175, 189, 381/191; 257/433, 659, 678, 684, 690; 438/51, 53; 29/25.41, 25.42
See application file for complete search history.

(56) References Cited

U.S. PATENT DOCUMENTS 5,740,261 A 4/1998 Loeppert
6,535,460 B2 3/2003 Loeppert
(Continued)

FOREIGN PATENT DOCUMENTS

EP 2363883 A1 9/2011
EP 2373059 A1 10/2011
(Continued)

OTHER PUBLICATIONS

International Search Report and Written Opinion for PCT/US2015/010616, dated Apr. 29, 2015 (10 pages).

*Primary Examiner* — Huyen D Le
(74) *Attorney, Agent, or Firm* — Foley & Lardner LLP

(57) ABSTRACT

A microphone includes an interposer, a lid, and a base. The interposer includes at least one wall portion that forms a cavity. The wall portion includes a first side and a second side that are opposite from each other. The lid is coupled to the first side of the interposer and the base is coupled to the second side of the interposer such that the lid and the base enclose the cavity. A microelectromechanical system (MEMS) device is disposed in the cavity. The interposer structurally supports one or both of the lid and the base. The interposer includes a plurality of plated regions that are configured to electrically connect the lid and the base. The plated regions are configured to at least partially be exposed and open to the cavity.

12 Claims, 5 Drawing Sheets

(51) Int. Cl.
*H04R 19/00* (2006.01)
*H04R 1/08* (2006.01)

(52) U.S. Cl.
CPC ......... *H01L2224/8592* (2013.01); *H04R 1/086* (2013.01); *H04R 2201/003* (2013.01)

(56) References Cited

U.S. PATENT DOCUMENTS

| | | |
|---|---|---|
| 6,552,469 B1 | 4/2003 | Pederson |
| 6,781,231 B2 | 8/2004 | Minervini |
| 6,847,090 B2 | 1/2005 | Loeppert |
| 7,166,910 B2 | 1/2007 | Minervini |
| 7,242,089 B2 | 7/2007 | Minervini |
| 7,297,567 B2 | 11/2007 | Loeppert |
| 7,381,589 B2 | 6/2008 | Minervini |
| 7,382,048 B2 | 6/2008 | Minervini |
| 7,434,305 B2 | 10/2008 | Minervini |
| 7,439,616 B2 | 10/2008 | Minervini |
| 7,466,834 B2 * | 12/2008 | Ogura et al. ............. 381/174 |
| 7,501,703 B2 | 3/2009 | Minervini |
| 7,537,964 B2 | 5/2009 | Minervini |
| 7,633,156 B2 | 12/2009 | Minervini |
| 8,018,049 B2 | 9/2011 | Minervini |
| 8,121,331 B2 | 2/2012 | Minervini |
| 8,170,244 B2 | 5/2012 | Ryan |
| 8,199,939 B2 * | 6/2012 | Suvanto et al. ............ 381/175 |
| 8,358,004 B2 | 1/2013 | Minervini |
| 8,450,817 B2 | 5/2013 | Minervini |
| 8,457,332 B2 | 6/2013 | Loeppert |
| 8,526,665 B2 | 9/2013 | Lutz |
| 8,594,347 B2 | 11/2013 | Ryan |
| 8,617,934 B1 | 12/2013 | Minervini |
| 8,618,619 B1 | 12/2013 | Miks et al. |
| 8,623,709 B1 | 1/2014 | Minervini |
| 8,623,710 B1 | 1/2014 | Minervini |
| 8,624,384 B1 | 1/2014 | Minervini |
| 8,624,385 B1 | 1/2014 | Minervini |
| 8,624,386 B1 | 1/2014 | Minervini |
| 8,624,387 B1 | 1/2014 | Minervini |
| 8,629,005 B1 | 1/2014 | Minervini |
| 8,629,551 B1 | 1/2014 | Minervini |
| 8,629,552 B1 | 1/2014 | Minervini |
| 8,633,064 B1 | 1/2014 | Minervini |
| 8,652,883 B1 | 2/2014 | Minervini |
| 8,704,360 B1 | 4/2014 | Minervini |
| 8,765,530 B1 | 7/2014 | Minervini |
| 8,781,140 B2 | 7/2014 | Lautenschlager |
| 8,791,531 B2 | 7/2014 | Loeppert |
| 8,879,767 B2 | 11/2014 | Wickstrom |
| 8,969,980 B2 | 3/2015 | Lee |
| 8,987,030 B2 | 3/2015 | Loeppert |
| 8,995,694 B2 | 3/2015 | Vos |
| 9,006,880 B1 | 4/2015 | Minervini |
| 9,023,689 B1 | 5/2015 | Minervini |
| 9,024,432 B1 | 5/2015 | Minervini |
| 9,040,360 B1 | 5/2015 | Minervini |
| 9,051,171 B1 | 6/2015 | Minervini |
| 9,061,893 B1 | 6/2015 | Minervini |
| 9,067,780 B1 | 6/2015 | Minervini |
| 9,078,063 B2 | 7/2015 | Loeppert |
| 9,096,423 B1 | 8/2015 | Minervini |
| 9,133,020 B1 | 9/2015 | Minervini |
| 9,137,595 B2 | 9/2015 | Lee |
| 9,139,421 B1 | 9/2015 | Minervini |
| 9,139,422 B1 | 9/2015 | Minervini |
| 9,148,731 B1 | 9/2015 | Minervini |
| 9,150,409 B1 | 10/2015 | Minervini |
| 2004/0253760 A1 | 12/2004 | Zhang |
| 2007/0215962 A1 | 9/2007 | Minervini |
| 2008/0142475 A1 | 6/2008 | Loeppert |
| 2008/0217709 A1 | 9/2008 | Minervini |
| 2010/0183174 A1 | 7/2010 | Suvanto et al. |
| 2010/0290644 A1 | 11/2010 | Wu et al. |
| 2010/0322451 A1 | 12/2010 | Wu et al. |
| 2012/0039499 A1 | 2/2012 | Ryan |
| 2012/0087521 A1 | 4/2012 | Delaus et al. |
| 2012/0148083 A1 | 6/2012 | Knauss et al. |
| 2013/0108074 A1 | 5/2013 | Reining |
| 2013/0177192 A1 | 7/2013 | Abry |
| 2013/0343590 A1 | 12/2013 | Nakagawa et al. |
| 2014/0037115 A1 | 2/2014 | Vos |
| 2014/0037120 A1 | 2/2014 | Lim |
| 2014/0037124 A1 | 2/2014 | Lim |
| 2014/0064546 A1 | 3/2014 | Szczech |
| 2014/0072151 A1 * | 3/2014 | Ochs et al. ............. 381/174 |
| 2014/0133686 A1 | 5/2014 | Lee |
| 2014/0177113 A1 | 6/2014 | Gueorguiev |
| 2014/0291783 A1 | 10/2014 | Talag |
| 2014/0291784 A1 | 10/2014 | Conklin |
| 2014/0294209 A1 | 10/2014 | Szczech |
| 2014/0321687 A1 | 10/2014 | Friel |
| 2015/0117681 A1 | 4/2015 | Watson |
| 2015/0139428 A1 | 5/2015 | Reining |
| 2015/0166335 A1 | 6/2015 | Loeppert |
| 2015/0172825 A1 | 6/2015 | Lim |
| 2015/0208165 A1 | 7/2015 | Volk |
| 2015/0251898 A1 | 9/2015 | Vos |

FOREIGN PATENT DOCUMENTS

| | | |
|---|---|---|
| EP | 2393307 A2 | 12/2011 |
| WO | 2011076910 A1 | 6/2011 |

* cited by examiner

INTERPOSER FOR MEMS-ON-LID MICROPHONE

CROSS REFERENCE TO RELATED APPLICATION

This application claims the benefit of U. S. Provisional Application No. 61/925,359 entitled "Interposer for MEMS-on-lid Microphone" filed Jan. 9, 2014, all of the contents of which are incorporated herein by reference in their entireties.

TECHNICAL FIELD

This application relates to MEMS microphones and, more specifically, to their construction.

BACKGROUND OF THE INVENTION

Various types of acoustic devices have been used over the years. One example of an acoustic device is a microphone. Generally speaking, a microphone converts sound waves into an electrical signal. Microphones sometimes include multiple components that include micro-electro-mechanical systems (MEMS) components and integrated circuits (e.g., application specific integrated circuits (ASICs)).

The acoustic performance of a microphone assembly is related in part to the ratio of front volume (i.e., the volume of air between the diaphragm and the acoustic port) to back volume (i.e., the volume of the air contained by the package cavity and diaphragm) of the assembly. In typical top port devices, the components are attached directly to the substrate or base and the acoustic port is located on the top or lid, making the front volume large relative to the back volume. This is not the preferred ratio needed for optimum performance (i.e. high sensitivity, flat wideband response) of a microphone assembly.

In other configurations, the MEMS components are disposed on the lid of the assembly instead of the base. In this case, a conductive path needs to be formed so that electrical signals created by the MEMS component can reach the exterior (via conductive pads on the base). Once the electrical signals reach the exterior conductive pads, these signals can be utilized by customer circuitry, such as circuitry found in cellular phones, computers, or other devices in which the microphone resides.

MEMS microphones are typically disposed in devices such as cellular phones and personal computers. It is desirable to make these devices as small as possible. Consequently, it is desirable to make the MEMS microphones as small as possible.

Further miniaturization and cost reduction of MEMS microphones using MEMS-on-lid configurations is challenging since the wall incorporates plated through vias to establish an electrical connection between the lid and base of the microphone. The vias require considerable space on the substrate (PCB) and leave little additional room for the cavity region that is used to house the MEMS die and the integrated circuits.

BRIEF DESCRIPTION OF THE DRAWINGS

For a more complete understanding of the disclosure, reference should be made to the following detailed description and accompanying drawings wherein.

Figure 1:
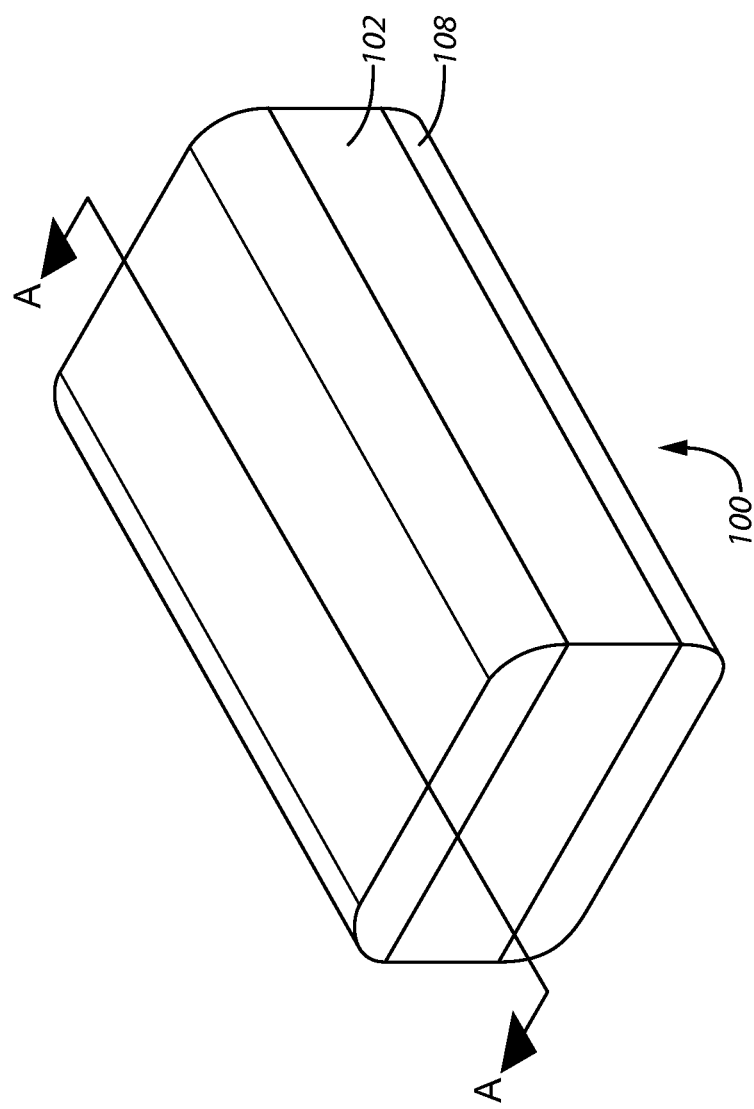
FIG. 1 comprises a perspective view of a first example of an interposer according to various embodiments of the present invention.

Skilled artisans will appreciate that elements in the figures are illustrated for simplicity and clarity. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

Approaches are described that provide an interposer utilized in MEMS microphones. The interposer, in one aspect, consists of a plated wall in which the plating faces the interior of the microphone. By "plated," it is meant that metallization is added to surfaces using an electroless plating process. The interposer serves as a structural support for the microphone and is also used as an electrical current path. The interposer may be on the same surface as a microelectromechanical system (MEMS) component and/or an application specific integrated circuit (ASIC). A wire bond may be used between the MEMS component and the ASIC.

The approaches described herein are particularly applicable to MEMS-on-lid microphone configurations. By MEMS-on-lid, it is meant that the MEMS component is disposed on the lid (or cover) of the device rather on the base (or substrate). The base (or substrate) typically includes traces or other conductive paths for the electrical signals to be transmitted.

In many of these embodiments, a microphone includes an interposer, a lid, and a base. The interposer includes at least one wall portion that forms a cavity. The wall portion includes a first side and a second side that are opposite from each other. The lid is coupled to the first side of the interposer and the base is coupled to the second side of the interposer such that the lid and the base enclose the cavity. A microelectromechanical system (MEMS) device is disposed in the cavity. The interposer structurally supports one or both of the lid and the base. The interposer includes a plurality of plated regions that are configured to electrically connect the lid and the base. The plated regions are configured to at least partially be exposed and open to the cavity.

In some examples, the at least one wall portion comprises a first wall and a second wall, and the plurality of plated regions comprises a first plated region disposed at the first wall and a second plated region disposed at the second wall. In other examples, the microphone further includes an application specific integrated circuit (ASIC) disposed in the cavity.

In other aspects, the MEMS device is coupled to the lid. In some examples, the lid comprises a multi-layer FR-4 printed circuit board. In other examples, the base comprises a printed circuit board at least partially constructed of an insulating material.

In still other aspects, the at least one wall includes an RF shield. The RF shield or a Faraday shield or Faraday pads to mention two examples. In still other aspects, the at least one wall portion comprises a first wall and a second wall, and the plurality of plated regions comprises a first plated region disposed at the first wall and an RF shield is disposed at the second wall. In still other examples, a port is disposed through the lid.

Figure 2:
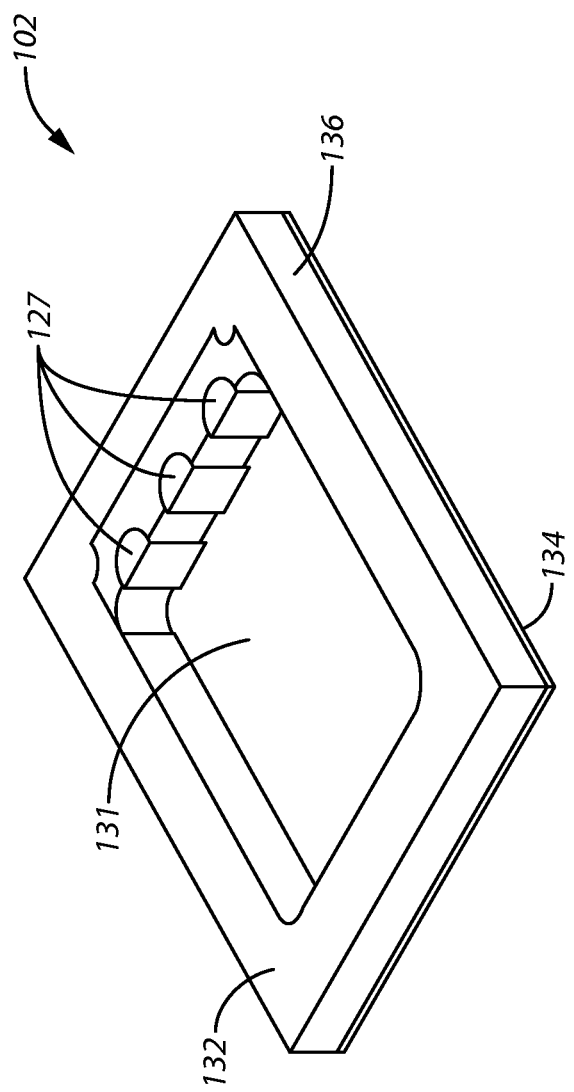
FIG. 2 comprises a perspective view of the interposer of FIG. 1 according to various embodiments of the present invention.
Figure 3:
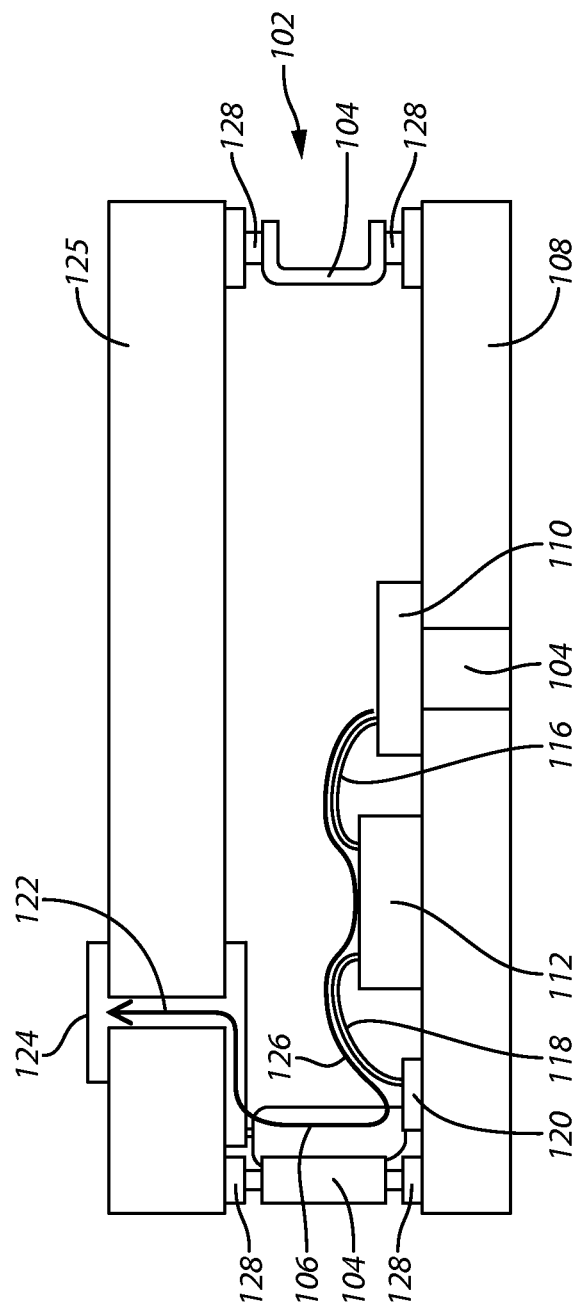
FIG. 3 comprises a side cutaway view of the current path of the apparatus of FIG. 1 and FIG. 2 along lines A-A of FIG. 1 according to various embodiments of the present invention.

Referring now to FIG. 1, FIG. 2, and FIG. 3, one example of a microphone assembly 100 is described. The microphone assembly 100 includes an interposer 102. The interposer includes a wall 104 and conductive plating 127. The microphone assembly 100 includes a lid 108, a microelectromechanical system (MEMS) component 110, and an application specific integrated circuit (ASIC) 112. A port 114 extends through the lid 108. An electrical path 126 extends from the MEMS component 110, through a wire 116, to the ASIC 112, through a wire 118, to a conductive pad 120, through conductive plating 127 on the interposer 102, through a conductive via 122, and to external conductive pads 124 that is on a base 125. The external conductive pads 124 couple to customer electronic components, for example, components found within cellular phones or personal computers to mention two examples. The conductive plating 127 is exposed to the interior cavity of the microphone assembly 100.

The MEMS component 110 includes a diaphragm and a back plate. The MEMS component 110 converts sound energy (received via the port 114) into an electrical signal. The ASIC 112 processes the electrical signal, for example, performing amplification or noise removal functions.

It will be appreciated that the microphone assembly 100 described herein is a MEMS-on-lid microphone where the MEMS component (and possibly the ASIC) are connected to the lid of the microphone assembly rather than the base. The lid 108 is constructed of a multi-layered FR-4 printed circuit board (PCB). The base 125, in one aspect, may be a printed circuit board, or may be constructed of electrically insulating material. Laser Direct Structuring may be used to generate and construct the conductive plating 127.

Referring now especially to FIG. 3, the current path from the MEMS component to the ASIC is described. As described, the MEMS component 110 and the ASIC 112 are disposed on the lid 108 of the microphone assembly 100. The electrical path 126 is configured to transmit electrical signals from the MEMS component 110, processed by the ASIC 112 and out to the exterior of the microphone assembly 100 where the electrical signals can be further used and processed by customer equipment. For example, it will be appreciated that the microphone assembly 100 can be deployed in a device such as a cellular phone or a personal computer. Other examples are possible.

The interposer 102 is plated with a first layer of metal 132 (e.g., copper), and a second layer of metal 134 (e.g., copper). The interposer 102 also is constructed of an electrically insulating material 136. The interposer 102 forms a cavity 131. The MEMS component 110 and the ASIC 112 are disposed in the cavity when the microphone assembly 100 is assembled.

The electrical path 126 extends from the MEMS component 110, through the wire 116, to the ASIC 112, through the wire 118, to the conductive pad 120, through the interposer 102, through a conductive via 122, and to external conductive pads 124. It will be appreciated that the various parts shown in the figures herein are connected or coupled together with electrical solder 128.

It can be seen that the interposer 102 is a structural support for the microphone assembly 100 and that it is used to provide the electrical current path 126. It can be further appreciated that the interposer 102 is on the same surface (i.e., a surface of the lid 108) as the MEMS component 110 and the ASIC 112. No additional epoxy process is needed to provide an acoustic seal between the interposer 102 and the lid 108 or the interposer 102 and the base 125 because the top and bottom surfaces contain a solderable ring of metallization that are sealed with solder after reflow.

Figure 4:
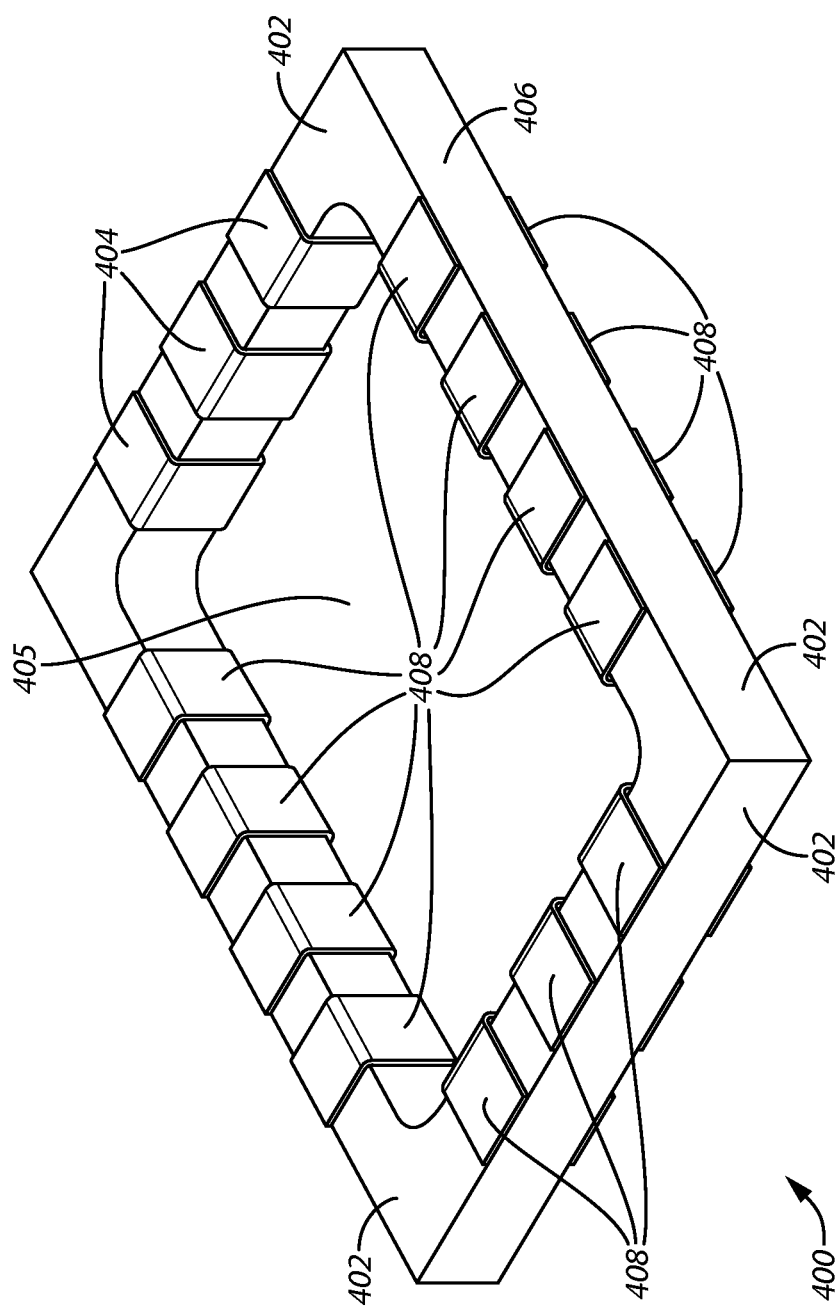
FIG. 4 comprises a perspective view of a second example of an interposer according to various embodiments of the present invention.

Referring now to FIG. 4, another example of an interposer 400 is described. The interposer 400 includes wall portions 402. The interposer 400 forms a cavity 405 in which the internal components of a microphone are deployed. It will be understood that the interposer 400 is positioned between a lid and a base (or substrate) and may be deployed relative to these components in the same way as the interposer 102 of FIG. 1 is positioned between the lid 108 and the base 125. Faraday pads 408 are disposed on the wall portions 402. The purpose of the Faraday pads 408 is to provide improved RF immunity.

Conductive plating 404 carries signals between the MEMS component (on the lid) and external devices (coupled to a pad on the base). In contrast to the example shown in FIGS. 1-3, the plating here is attached to electrically insulating material 406 that forms the wall portions 402.

This interposer configuration of FIG. 4 increases the volume of the cavity 405 significantly because all electrical connections run along the inner surface of the interposer. In some examples, the cavity volume is increased by 47% compared to previous microphones. In some aspects, additional epoxy processes to generate and acoustic seal between the interposer and the lid and base PCB are required because there are gaps between the solder joints that connect the lid, interposer and base PCB surfaces.

Figure 5:
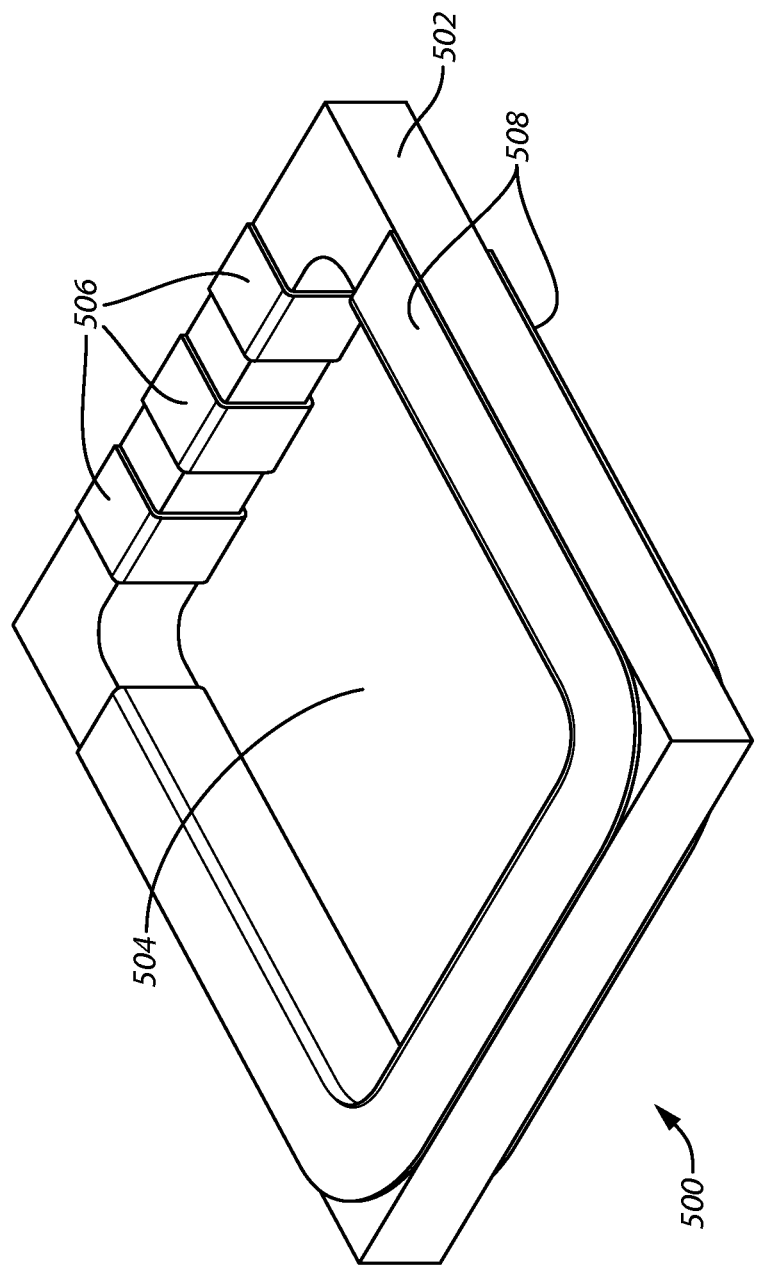
FIG. 5 comprises a perspective view of a third example of an interposer according to various embodiments of the present invention.

Referring now to FIG. 5, still another example of an interposer 500 is described. The interposer 500 includes a wall portion 502, a cavity 504, conductive plating 506, and a horseshoe Faraday shield 508. The purpose of the Faraday shield 508 is to improve RF immunity.

It will be understood that the interposer 500 is positioned between a lid and a base (or substrate) and may be deployed relative to these components in the same way as the interposer 102 of FIG. 1 is positioned between the lid 108 and the base 125.

The conductive plating 506 carries signals between the MEMS component (on the lid) and external devices (coupled to a pad on the base). In contrast to the example shown in FIGS. 1-3, the plating here is attached electrically insulating material 510 that forms the wall portions 502.

Preferred embodiments of this invention are described herein, including the best mode known to the inventors for carrying out the invention. It should be understood that the illustrated embodiments are exemplary only, and should not be taken as limiting the scope of the invention.

What is claimed is:

1. A microphone, the microphone comprising:
an interposer, the interposer including a first wall, a second wall, a third wall, and a fourth wall, wherein the first wall is opposite the second wall and the third wall is opposite the fourth wall, the first wall, second wall, third wall and fourth wall forming a cavity, the interposer further including a first side and a second side, the first side and the second side being opposite from each other and orthogonal to the first wall, second wall, third wall, and fourth wall, wherein the first side is plated with a first metallic material and the second side is plated with a second metallic material to provide an acoustic seal;

a lid coupled to the first side of the interposer;

a base coupled to the second side of the interposer such that the lid and the base enclose the cavity;

a microelectromechanical system (MEMS) device disposed in the cavity;

such that the interposer structurally supports one or both of the lid and the base, the interposer including a plurality of plated regions that are configured to electrically connect the lid and the base, the plated regions being configured to at least partially be exposed and open to the cavity.

2. The microphone of claim 1, further comprising an application specific integrated circuit (ASIC) disposed in the cavity.

3. The microphone of claim 1, wherein the MEMS device is coupled to the lid.

4. The microphone of claim 1, wherein the lid comprises a multi-layer FR-4 printed circuit board.

5. The microphone of claim 1, wherein the base comprises a printed circuit board at least partially constructed of an insulating material.

6. The microphone of claim 1, wherein the at least one wall includes an RF shield.

7. The microphone of claim 6, wherein the RF shield comprises a Faraday shield or Faraday pads.

8. The microphone of claim 1, wherein the at least one wall portion comprises a first wall and a second wall, and wherein the plurality of plated regions comprises a first plated region disposed at the first wall and wherein an RF shield is disposed at the second wall.

9. The microphone of claim 1, wherein a port is disposed through the lid.

10. The microphone of claim 1, wherein the first metallic material and the second metallic material are a same type of metallic material.

11. The microphone of claim 1, wherein the lid and the base are not supported by any structure other than the interposer.

12. The microphone of claim 1, wherein the first metallic material and the second metallic material form solderable rings of metallization that are sealed with solder after reflow.

* * * * *